US009077447B1

(12) United States Patent
Mohageg (10) Patent No.: US 9,077,447 B1
(45) Date of Patent: Jul. 7, 2015

(54) SIGNAL FILTERS IN DOUBLE PASS AND SAGNAC CONFIGURATIONS

(75) Inventor: Makan Mohageg, Granada Hills, CA (US)

(73) Assignee: OEwaves, Inc., Pasadena, CA (US)

( * ) Notice: Subject to any disclaimer, the term of this patent is extended or adjusted under 35 U.S.C. 154(b) by 182 days.

(21) Appl. No.: 13/532,707

(22) Filed: Jun. 25, 2012

Related U.S. Application Data (60) Provisional application No. 61/500,577, filed on Jun. 23, 2011.

(51) Int. Cl.
*H04B 10/00* (2013.01)
*H04B 15/02* (2006.01)

(52) U.S. Cl.
CPC ..................... *H04B 15/02* (2013.01)

(58) Field of Classification Search
CPC ....................................... H04B 10/00
USPC ..................... 398/25, 82, 140, 182
See application file for complete search history.

(56) References Cited

U.S. PATENT DOCUMENTS

| 5,818,986 | A * | 10/1998 | Asawa et al. ............... 385/24 |
| 5,887,092 | A * | 3/1999 | van der Tol ............... 385/27 |
| 5,953,467 | A * | 9/1999 | Madsen ....................... 385/15 |
| 6,212,002 | B1 * | 4/2001 | Lin et al. ..................... 398/160 |
| 6,975,797 | B2 * | 12/2005 | Chen et al. .................. 385/48 |
| 2004/0234192 | A1 * | 11/2004 | Madsen ....................... 385/24 |

* cited by examiner

*Primary Examiner* — Agustin Bello
(74) *Attorney, Agent, or Firm* — Fish & Tsang, LLP (57) ABSTRACT

Signal filter designs and techniques use a signal filter of a given order to achieve a higher order filter operation than what the filter is designed for. In various implementations, the present signal filter designs and techniques allow achieving desired high order filter operation without using a high order filter. Specific examples are provided to use a double pass configuration to feed a once filtered signal by a filter back to the filter to filter the feedback signal for the second time and a Sagnac interferometer configuration to cause interference between two once filtered signals.

21 Claims, 12 Drawing Sheets

SIGNAL FILTERS IN DOUBLE PASS AND SAGNAC CONFIGURATIONS

PRIORITY CLAIM AND CROSS-REFERENCES TO RELATED APPLICATIONS

This patent document claims the benefit of U.S. Provisional Application No. 61/500,577 entitled "RF and Optical Filter in Sagnac Configuration" and filed Jun. 23, 2011, the disclosure of which is incorporated by reference as part of the specification of this document.

BACKGROUND

This patent document relates to signal filtering and filtering devices including signal filtering based on multiple-pole filters.

Signal filters with multiple poles can be used to achieve steep roll-off at the edge of the transmission band of the filters. Steep roll-off in signal filters is desirable in various applications. The number of poles of a filter can be designed to be high in order to achieve a certain level of steepness of the roll-off. In RF circuits, an RF filter based on electronic circuit elements require a large number of inductors and capacitors to achieve a large number of poles. Therefore, an RF filter with a steep roll-off can be a complex and large in structure and can be expensive. In optical devices or systems, optical filters with multiple poles can be constructed by coupling multiple optical filters to one another. A large number of optical filters can be coupled to form a composite optical filter with a large number of poles in the filter transfer function of the composite filter.

SUMMARY

This patent document provides signal filter designs and techniques that use a signal filter of a given order to achieve a higher order filter operation than what the filter is designed for. In various implementations, the present signal filter designs and techniques allow achieving desired high order filter operation without using a high order filter. Specific examples are provided to use a double pass configuration to feed a once filtered signal by a filter back to the filter to filter the feedback signal for the second time and a Sagnac interferometer configuration to cause interference between two once filtered signals.

In one aspect, a method for filtering a signal at a radio frequency (RF) or optical frequency is provided to include splitting an input signal to be filtered into a first input signal and a second input signal; operating a spectral bandpass filter, which is configured to have a spectral transmission band that transmits spectral signal components of a signal that passes through the filter as a filtered output signal while blocking other spectral components, to filter the first input signal as a first filtered signal; operating the same spectral bandpass filter to filter the second input signal as a second filtered signal; and bringing the first and second filtered signals to together to cause an interference between the first and second filtered signals to produce an interference signal as a filtered output signal to effectuate a higher order filter operation than what the filter is designed for.

In another aspect, a device for filtering a signal is provided to include a signal coupler that has a first coupler port for receiving an input signal to be filtered and splits the received input signal into a first input signal and a second input signal. The signal coupler further includes a second coupler port that outputs the first input signal, a third coupler port that outputs the second input signal, and a fourth coupler port. A filter is provided to include a filter input port coupled to the second coupler port to receive the first input signal and a filter output port for outputting a first filtered signal by filtering the first input signal. The filter is configured to have a spectral transmission band that transmits spectral signal components of a signal that passes through and is filtered by the filter as a filtered output signal while blocking other spectral components. The filter output port is coupled to the third coupler port for receiving the second input signal to produce a second filtered signal at the filter input port by filtering the second input signal and for directing the first filtered signal to the third coupler port. The first filtered signal received at the third coupler port of the signal coupler and the second filtered signal received at the second coupler port are mixed to interfere with each other in the signal coupler to produce a final signal a part of which is output at the fourth coupler port as a filtered output signal of the device.

In yet another aspect, a device for filtering a signal is provided to include a signal coupler that receives an input signal to be filtered and outputs at least a portion of the received input signal as a coupler output signal and a second input signal. The signal coupler further receives a feedback signal that is generated based on the coupler output signal and mixes the feedback signal and the received input signal to produce the coupler output signal. This device includes a filter including a filter input port in communication with the signal coupler for receiving the coupler output signal and a filter output port for outputting a filtered signal by filtering the coupler output signal. The filter is configured to have a spectral transmission band that transmits spectral signal components of a signal that passes through the filter as a filtered output signal while blocking other spectral components. A signal power divider in communication with the filter output port to receive the filtered signal and to split the received filtered signal into a first signal as the filtered output signal of the device and a second signal as the feedback signal to the signal coupler. A feedback path is coupled between the signal coupler and the signal power divider to carry the feedback signal. The second signal is a filtered version of the input signal and thus feeding back of the second signal to the signal coupler enables a double pass configuration for the filter. In some implementations, a phase shifter is coupled in the feedback path between the signal coupler and the signal power divider and is operable to control a phase of the feedback signal at the signal coupler.

Various aspects of the signal filter designs and techniques are described in greater detail in the drawings, the description and the claims.

DETAILED DESCRIPTION

The filter designs and techniques described in this document are for filters in optical frequency ranges and filters in RF and microwave frequency ranges. As an example, an optical filter configuration of N-poles is used to generate a 2N-pole filter transfer function by connecting the filter in a novel Sagnac Configuration due to similarities to a Sagnac interferometer. Simulations of the N-pole filter under different input and output configurations are carried out using numerical techniques. The simulations suggest that running the N-pole filter in a double-pass configuration results in a 2N-type transfer function near the band pass, crossing over to an N-type transfer function far out of band. The simulations also suggest that running the N-pole filter in a Sagnac configuration, that is, sending the input beam into port 1 and port N of the N-pole filter, then coherently recombining the two output beams, results is a filter transfer function nearly identical to a 2N filter in both phase and magnitude.

Figure 1:
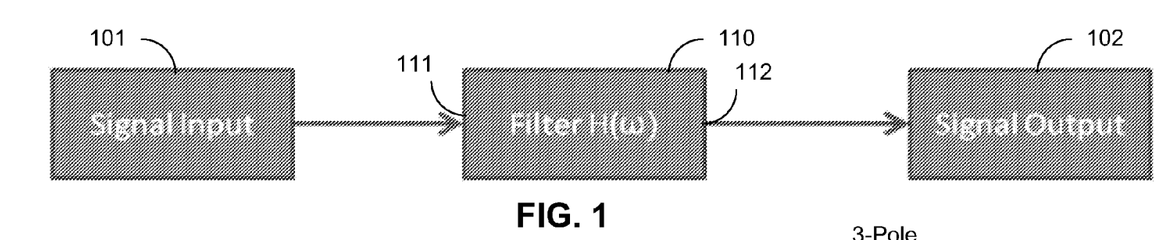
FIG. 1 shows an example of an N-pole filter used in a signal filtering application.

FIG. 1 shows an example of an N-pole filter 110 used in a signal filtering application. An input signal 101 is directed to the input port of the filter 110. The filter 110 operates to filter the input signal 101 to produce a filtered output signal 102 at its output port 112. Under this operation, the input signal passes through the filter 110 once and the filtered signal 102 is a once-filtered signal.

The transfer function H(ω) of an ideal, lossless, n-pole Butterworth filter centered around 0 Hertz can be described by the following power series $$\frac{1}{H(\omega)} = \prod_{k=1}^{n} i \frac{w - w_p \exp\left[\frac{i\pi(2k+n-1)}{2n}\right]}{\omega_p} \quad [1]$$

where ω is the angular frequency of the input signal, $\omega_p$ is the filter bandpass and n is the order number of the filter (which is also the number of poles of the filter).

Figure 2A:
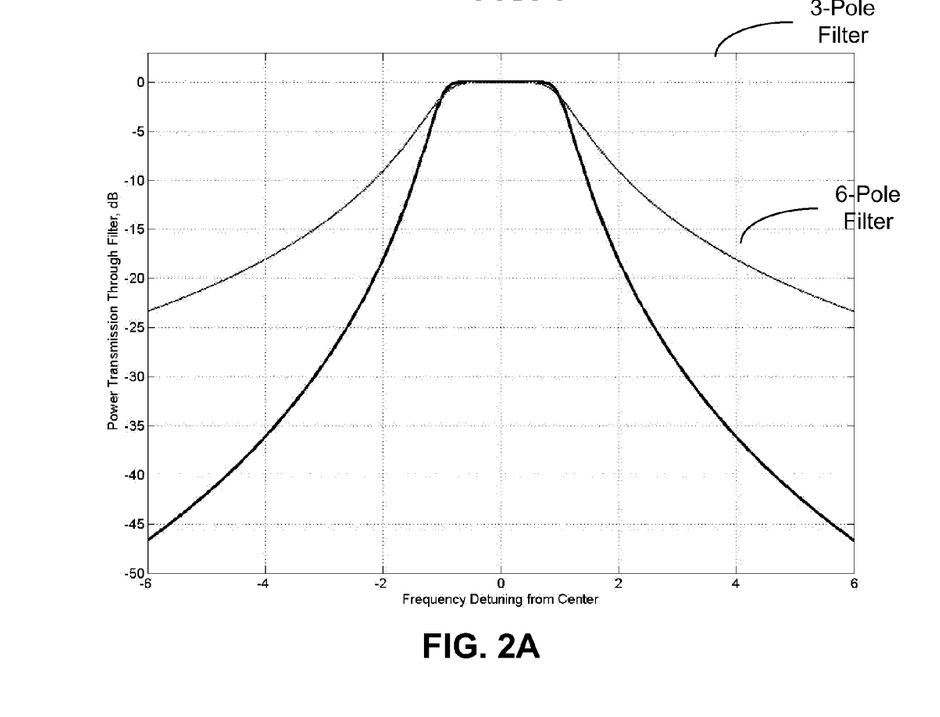
FIGS. 2A and 2B show examples of the filter power transfer functions and phase transfer functions of 3-pole and 6-pole filters to illustrate the effects of the number of poles on the filter performance.
Figure 2B:
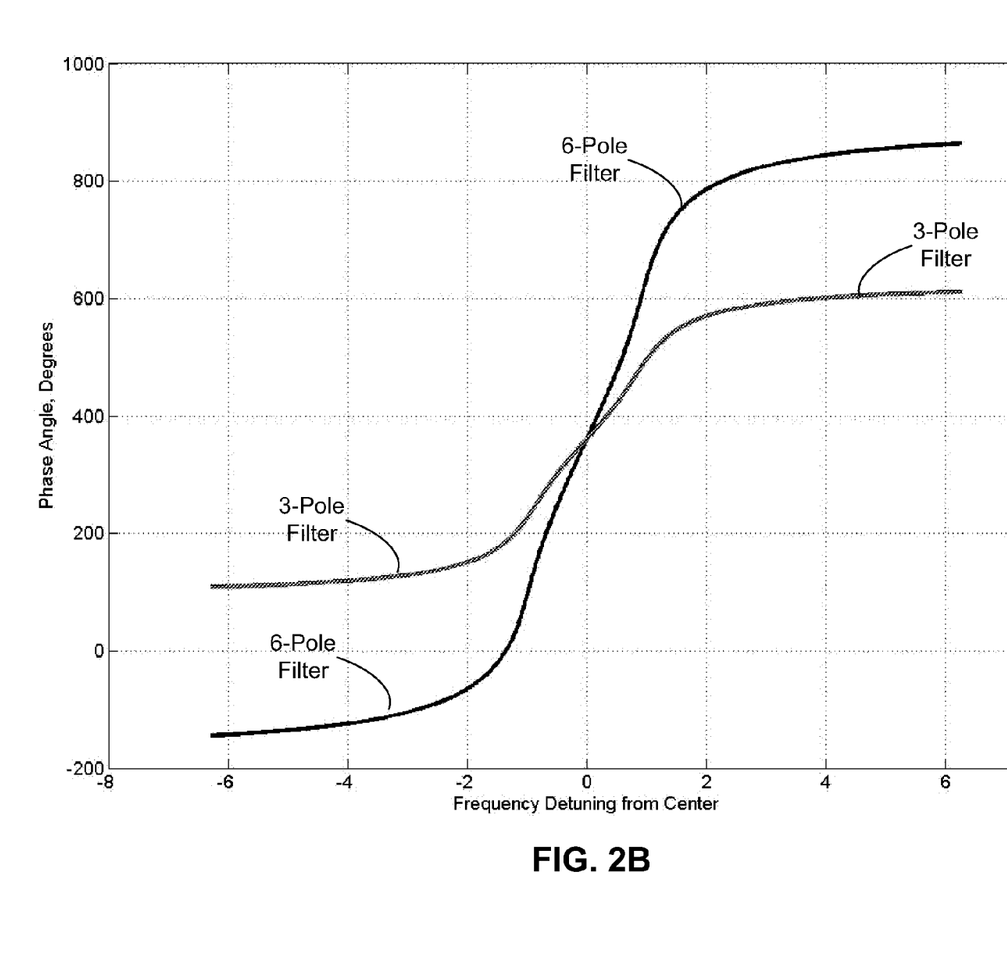

FIGS. 2A and 2B graphically represent the power and phase transfer functions of 3-pole (red) and 6-pole (black) filters based on the device configuration in FIG. 1 where the input signal is filtered once by the filter. This comparison suggests that higher order filters are desirable for achieving a flat transmission top in the transmission band and steep roll-off at the edge of the transmission band. High order filters, both optical filters and RF/microwave filters, however, tend to require complex components and thus can be bulky and expensive. The present designs and techniques use a signal filter of a given order to achieve a higher order filter operation than what the filter is designed for.

Figure 3:
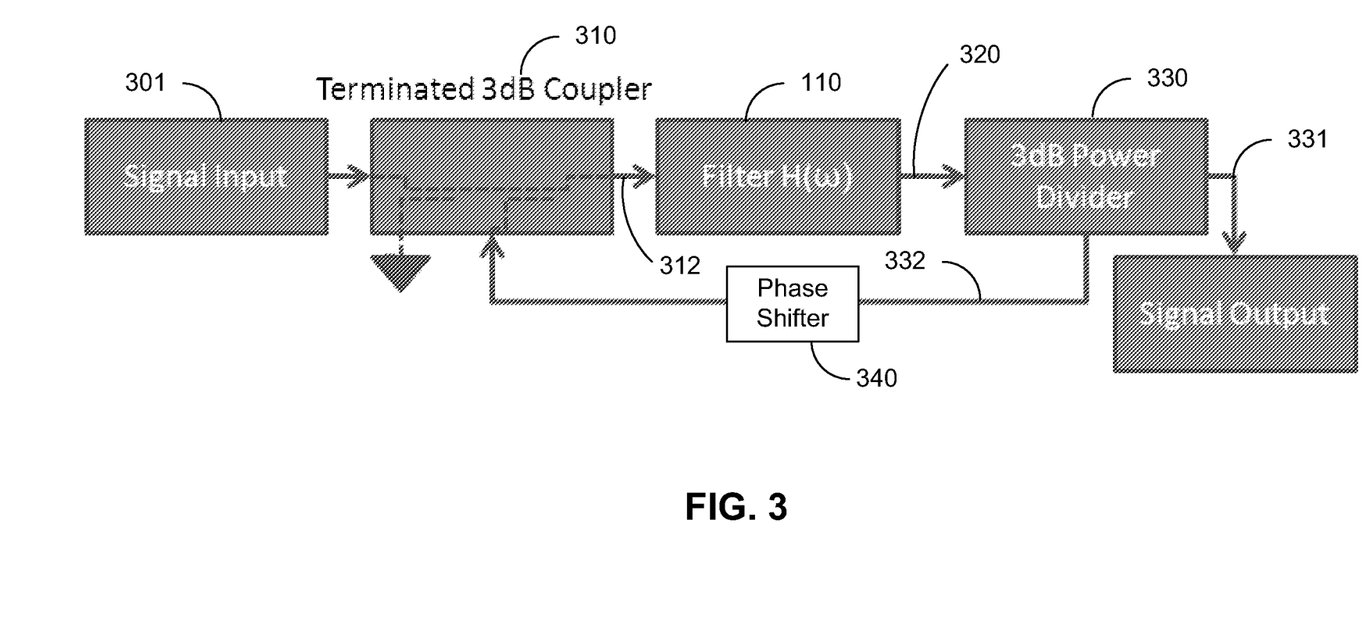
FIG. 3 shows an example of a double pass filter configuration that uses an N-pole filter to achieve a 2N-pole filter transfer function without a 2N-pole filter.

FIG. 3 shows an example of a double pass filter configuration that uses an N-pole filter to achieve a 2N-pole filter transfer function without a 2N-pole filter. The device in FIG. 1 for filtering a signal includes a signal coupler 310 that receives an input signal 301 to be filtered and outputs at least a portion of the received input signal as a coupler output signal 312 and a second input signal 332. The signal coupler 310 can be implemented in various configurations, e.g., a terminated 3 dB coupler as shown where the coupler 310 is a 4-port coupler where one port is terminated and the 3 other ports are used as two input ports for receiving the signals 301 and 332 and one output port for exporting the signal 312. The signal coupler 310 receives a feedback signal as the second input signal 332 that is generated based on the coupler output signal 312 and mixes the feedback signal 332 and the received input signal 301 to produce the coupler output signal 312. This device includes a filter 110 which includes a filter input port 111 in communication with the signal coupler 312 for receiving the coupler output signal 312 and a filter output port 112 for outputting a filtered signal 320 by filtering the coupler output signal 312. The filter 110 is configured to have a spectral transmission band that transmits spectral signal components of a signal that passes through the filter as a filtered output signal while blocking other spectral components. FIG. 2A shows two examples of such filter transmission transfer functions.

In FIG. 3, a signal power divider 330 is provided to be in communication with the filter output port 112 to receive the filtered signal 320 and to split the received filtered signal 320 into a first signal as the filtered output signal 331 of the device and a second signal as the feedback signal 332 to the signal coupler 310. A feedback path is coupled between the signal coupler 310 and the signal power divider 330 to carry the feedback signal 332. This feedback path for the second input signal 332 is a passive feedback and does not create any regenerative processing or oscillation based on this feedback. The second signal 332 is a filtered version of the input signal 301 and thus feeding back of the second signal 332 to the signal coupler 310 enables a double pass configuration for the filter 110. In some implementations, a phase shifter 340 is coupled in the feedback path between the signal coupler 310 and the signal power divider 330 and is operable to control a phase of the feedback signal 332 at the corresponding input port of the signal coupler 310 for proper operation of the filter device.

The addition of a directional coupler and power divider allows for the signal to propagate through the filter twice. In this dual pass configuration, the total transfer function is $$H_{dual-pass} = H \cdot \frac{1 + H \cdot e^{\frac{i\pi}{2}}}{2} \quad [2]$$

Figure 4:
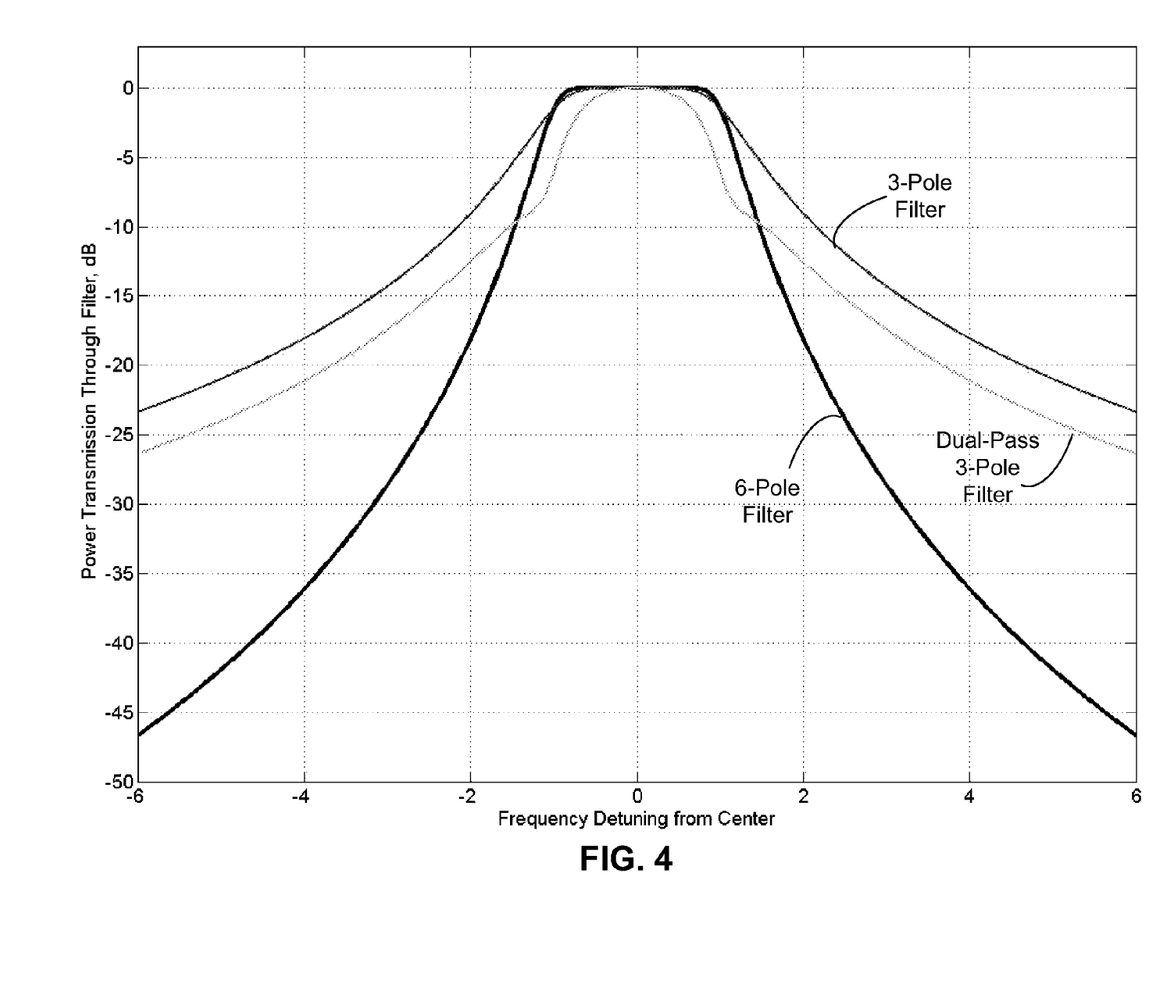
FIGS. 4 and 5 show comparisons of filter transfer functions of a dual-pass 3-pole filter based on FIG. 3 and 3-pole and 6-pole filters based on FIG. 1.
Figure 5:
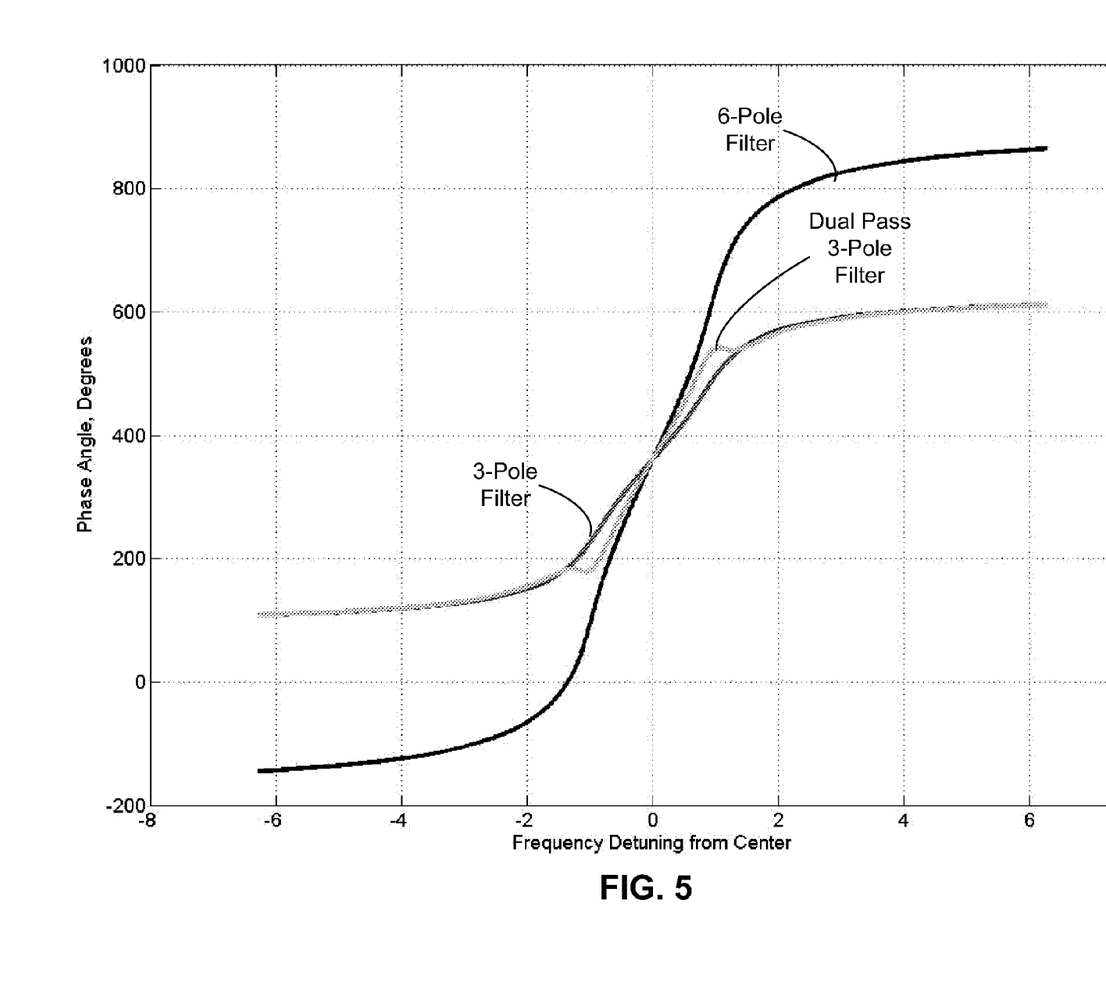

This results in a net transfer function that is 2N-like near the band center and N-like away from band center, as depicted in FIGS. 4 and 5.

Figure 6:
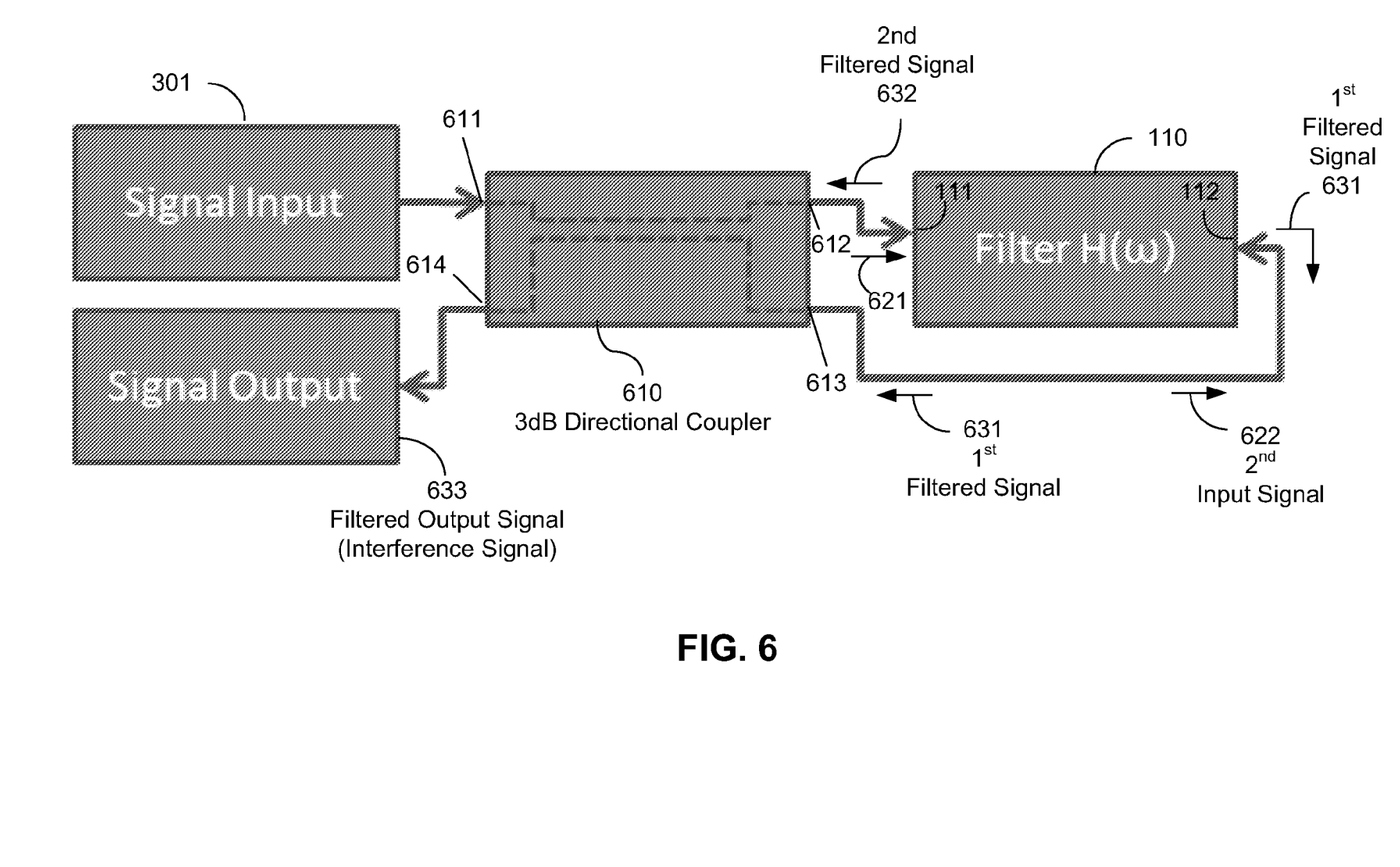
FIG. 6 shows an example of a filter device that uses an N-pole filter in a Sagnac interferometer configuration to achieve a 2N-pole filter transfer function.

FIG. 6 shows an example of a filter device that uses an N-pole filter in a Sagnac interferometer configuration to achieve a 2N-pole filter transfer function. In this example, a four-port directional coupler 610 is used to run a single N-pole filter 110 in a Sagnac configuration.

The four-port signal coupler 610 has a first coupler port 611 for receiving an input signal 301 to be filtered and splits the received input signal 301 into a first input signal 621 and a second input signal 622. The signal coupler 610 includes a second coupler port 612 that outputs the first input signal 621 towards the filter 110, a third coupler port 613 that outputs the second input signal 622, and a fourth coupler port 614 as the device output port. The filter 110 includes a filter input port 111 coupled to the second coupler port 612 to receive the first input signal 621 and a filter output port 112 for outputting a first filtered signal 631 by filtering the first input signal 621. The filter output port 112 is coupled to the third coupler port 613 of the coupler 610 for receiving the second input signal 622 to produce a second filtered signal 632 at the filter input port 111 by filtering the second input signal 622. The filter output port 112 is also used for directing the first filtered signal 631 to the third coupler port 613 of the coupler 610.

In operation, the first filtered signal 631 received at the third coupler port 613 of the signal coupler 610 and the second filtered signal 632 received at the second coupler port 612 are mixed inside the signal coupler 610 to interfere with each other and this interference produces produce a final signal a part of which is output at the fourth coupler port 633 as a filtered output signal 633 of the device.

The path traveled by each arm after splitting is equivalent. Assuming an otherwise reciprocal path in the filter 110 in both directions via the ports 111 and 112, no differential phase difference is expected when the first filtered signal 631 received at the third coupler port 613 of the signal coupler 610 and the second filtered signal 632 received at the second coupler port 612 are mixed inside the signal coupler 610 to interfere. Under this design, no phase shifter is needed.

The total filter transfer function of the device in FIG. 6 is $$H_{Sagnac} = H \cdot H \cdot e^{i\pi/2} \quad [3]$$

Figure 7:
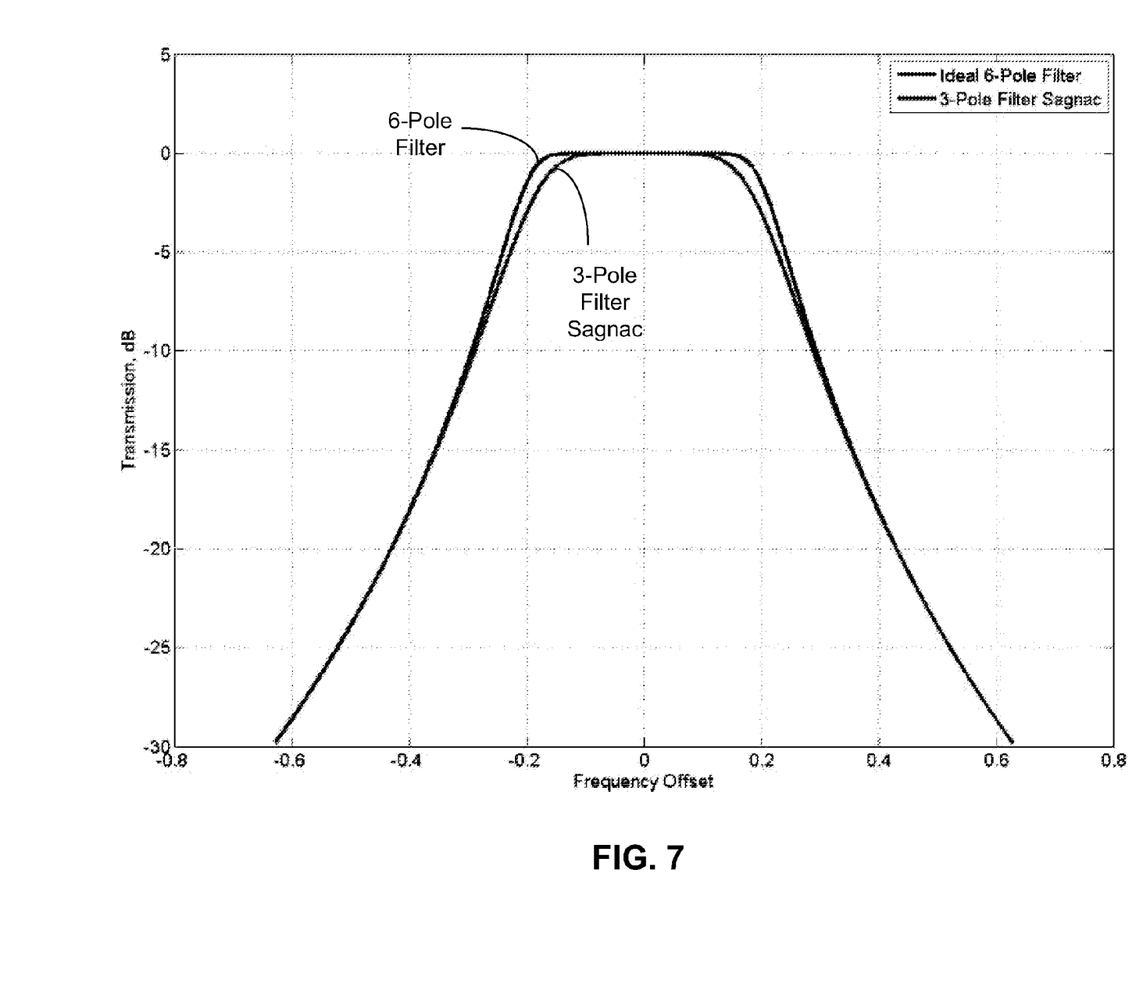
FIGS. 7, 8, 9 and 10 show various filter performance comparisons of the filter devices in FIGS. 1, 3 and 6.

The above example and its operation are based on the assumptions that a uniform phase shift across all frequencies. Because the length of the connections between elements could be larger than the signal wavelength, there is an effective wavelength dependent phase delay in the circuit. The differential delay can be expressed as $$\tau = \frac{d\varphi}{d\omega} \cdot \frac{L}{v_g} = \frac{L(f - f_o)}{f \cdot c \cdot \sqrt{1 - \left(\frac{f_c}{f}\right)^2}} \approx \frac{(f - f_o)}{f} \cdot \frac{L}{c} \quad [4]$$

where L is the path length differential between the two arms, f is the frequency, $f_0$ is the design frequency, c is the speed of light, and $f_c$ is the waveguide lower cutoff frequency for the RF waveguide or optical waveguide. In the approximation, it is assumed that the operational frequency is far away from the cutoff frequency of the waveguide. The gauge of phase is set to zero at the filter center frequency. Note that Eq. 4 is valid only when the path length L is greater than the guided mode wavelength of the RF/microwave or optical circuit. The effect of path length mismatch on the circuit is shown in FIG. 7 for a 3-pole filter in a Sagnac configuration where the differential path length mismatch alone has no discernable effect on the overall filter performance.

In FIG. 6, the directional coupler 610 used to split the input beam and recombine the counter propagating filtered waves may have some level of back reflection (BR). If we assume a linear BR coefficient of d that is not frequency dependent, the total transfer function is $$H_{Output} = H \cdot H \cdot e^{\frac{i\pi}{2}} - d + \frac{1}{1-d} H \cdot H \cdot e^{\frac{i\pi}{2}} \quad [5]$$

Figure 8:
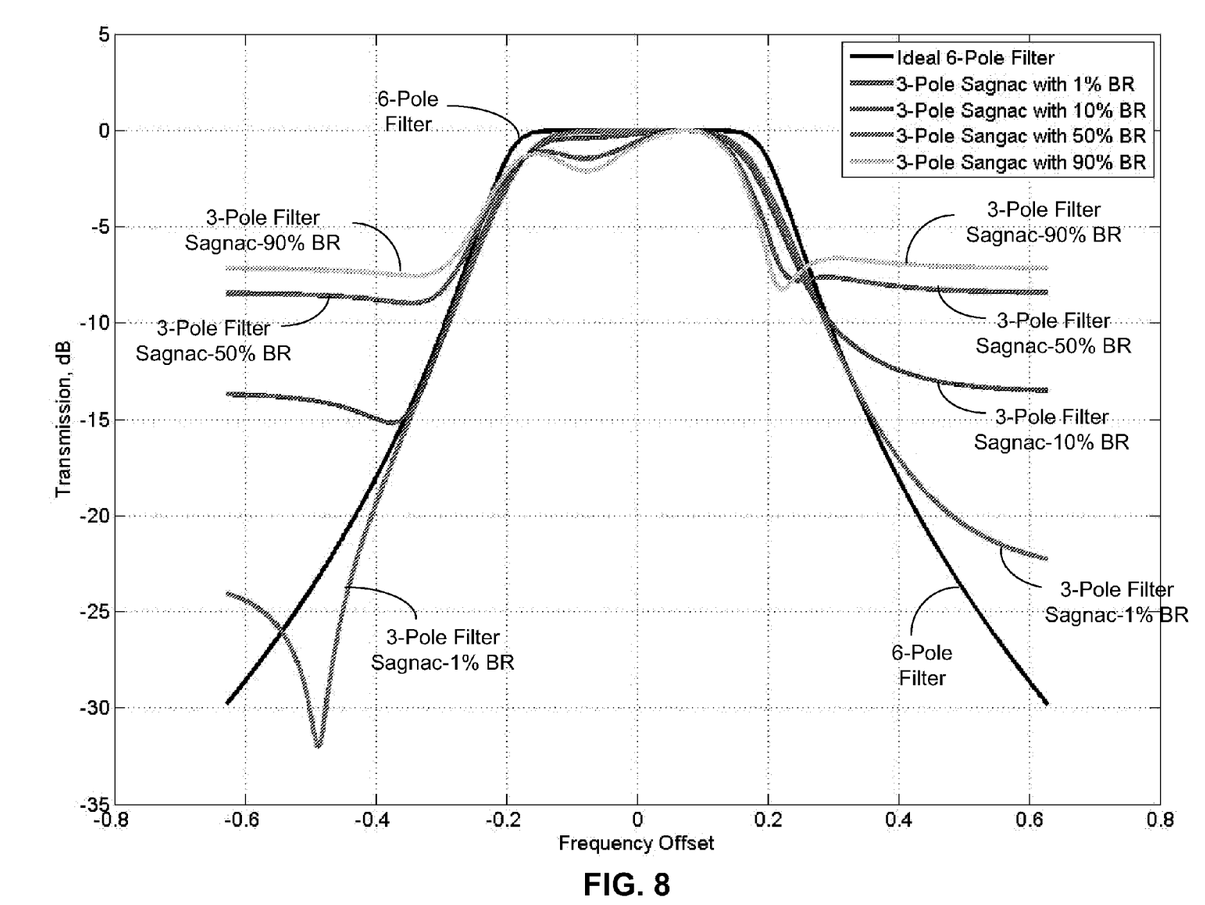

Under this condition, the effect of coupler BR on the overall output transfer function can be dramatic, as shown in FIG. 8 where effects of different levels of nonzero coupler back reflection of 1%, 10%, 50% and 90% on filter transfer function are shown.

Figure 9:
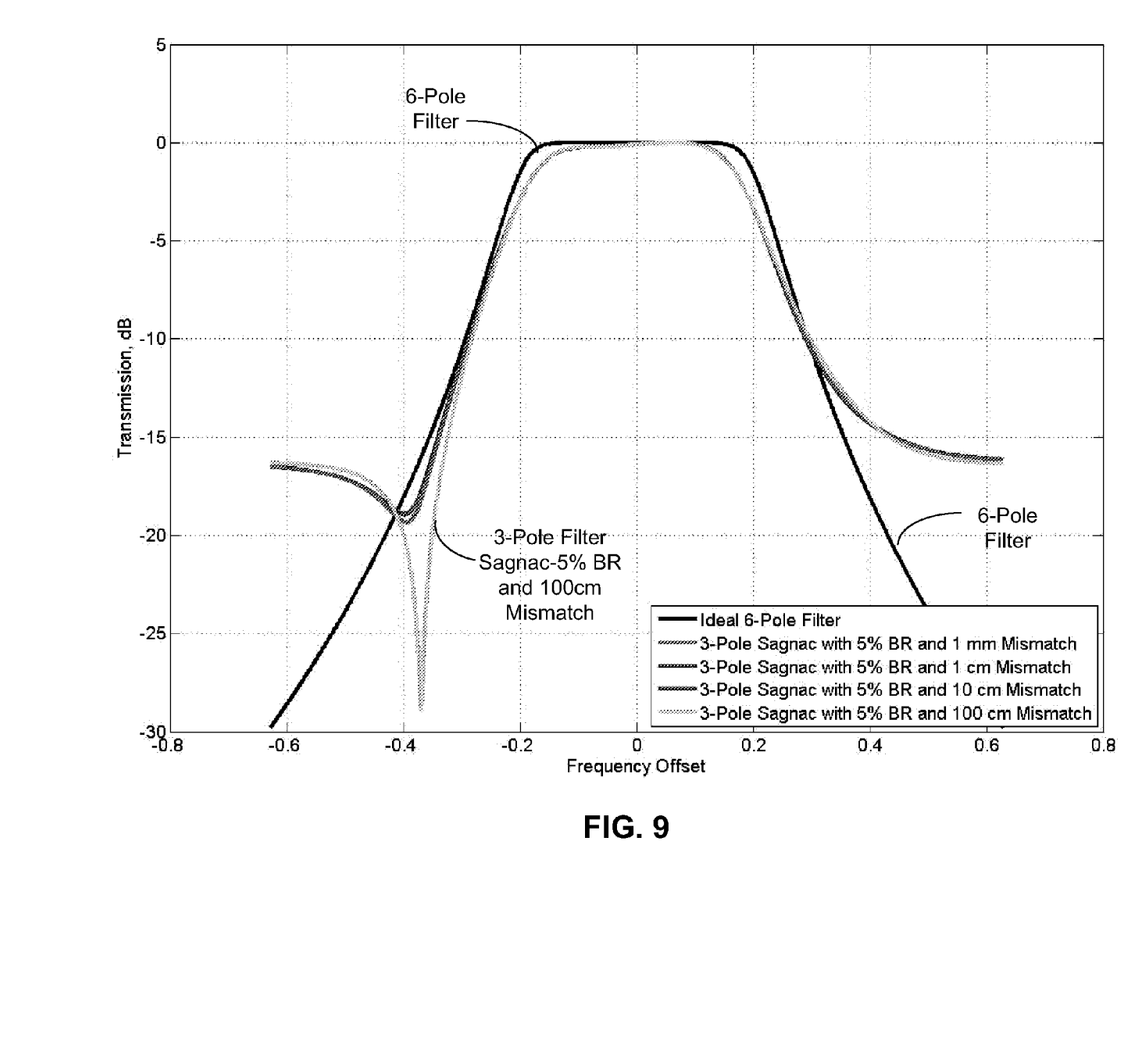

In the presence of nonzero coupler back reflection, the otherwise benign effect of path length mismatch adds to the structure of the transfer function. Physically, this can be understood by considering the non reciprocity of the counter propagating paths. Since there is back reflection, the waves will interfere due to the path length mismatch. The result of the combined effect is shown in FIG. 9 in which the result of 5% back reflection combined with different path length mismatches in the Sagnac filter is shown for the center frequency at 10 GHz. Not surprisingly, path mismatches under 1.0 cm do not change the filter transfer function much. This is because the path length mismatch is less than a wavelength. When the path length mismatch is more than a wavelength, the high-Q notch related to the ring resonance becomes evident.

Figure 10:
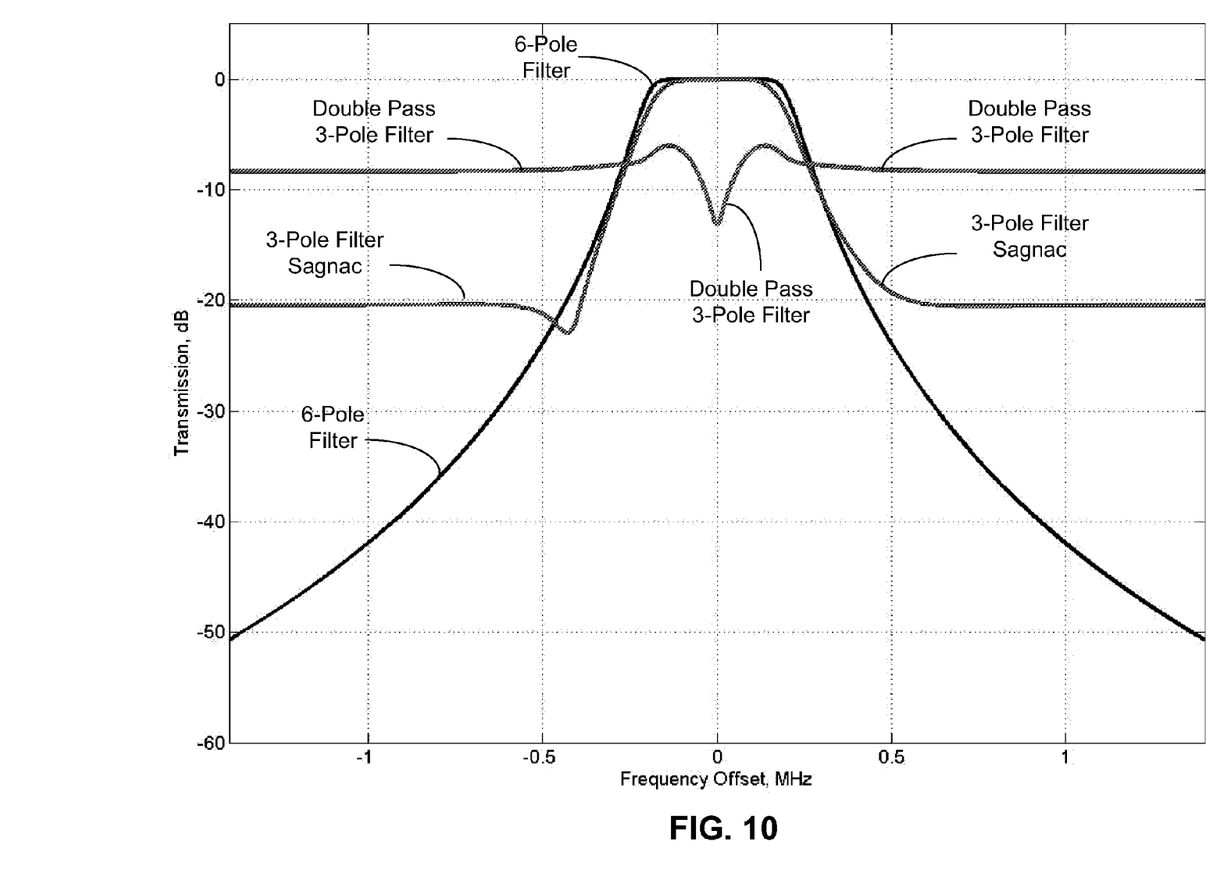

FIG. 10 shows a comparison of performances of the Dual-Pass and Sagnac Filters in FIGS. 3 and 6 for a 3-pole filter When the nonzero back reflection and mismatched path lengths are applied to the dual-pass filter, the noise problems are amplified. The dual pass filter, all else being equal, exhibits more insertion loss and lower out of band rejection than a Sagnac filter built to the same specifications. A phase shifter can be added to the return arm of the dual-pass filter to remove the structure near CF.

Based on the model, the following tolerances can be provided for the Sagnac filter for the parameter of the Voltage Standing Wave Ratio (VSWR):
1. For out of band rejection of 15 dB, coupler VSWR<1.07
2. For out of band rejection of 30 dB, coupler VSWR<1.002
3. For out of band rejection of 60 dB, coupler VSWR<1.00002
4. Path mismatch<1.0 cm @ 10 GHz signal; generally path mismatch less than design wavelength 15 dB OOB rejection (out of band rejection) can be achieved with off the shelf components. 30 dB can also be achieved by using a "22 dB VSWR" splitter. Beyond this requires custom microwave couplers. The path mismatch can be minimized by using surface mount components.

Figure 11:
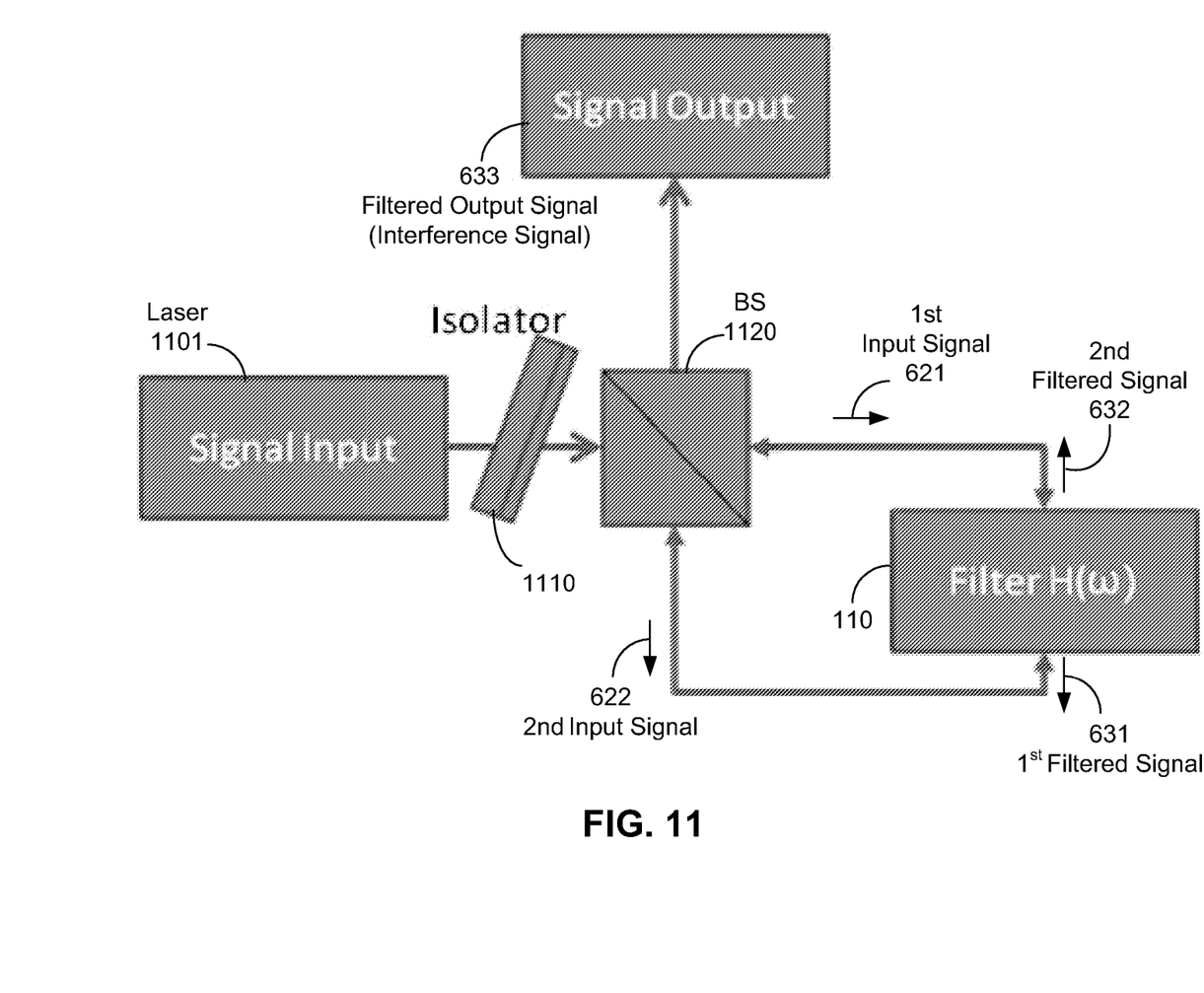
FIG. 11 shows an optical filter based on an optical Sagnac interferometer configuration by using an optical beam splitter.

FIG. 11 shows an optical filter based on an optical Sagnac interferometer configuration by using an optical beam splitter. The dramatic requirements for good OOB rejection can be readily achieved in the optical regime. In this example, a laser or an optical device 1101, such as an optical transmitter or an optical receiver, is provided to generate the input optical signal. An optical isolator 1110 may be provided to prevent optical feedback to the device 1101. An optical beam splitter BS 1120, e.g., a beam splitting cube, is used to split the input optical signal into the first input signal 621 and the second input signal 622 two the opposite ports of the filter 110. The BS 1120 then combines the first and second filtered signals 631 and 632 to overlap them spatially to cause the optical interference between the two filtered beams. This interference generates the filtered output signal 633.

In FIG. 11, the principle back reflection likely comes from the surface interface of the non polarizing beam splitter cube 1120, and the filter coupling elements. Assuming an operational wavelength of 1550 nm, the 'off-the-shelf' coating "AR.18" developed by Newport Corporation provides 0.05% maximum back reflection. Furthermore, the presence of coupling lenses and off-axis prisms in the example of an optical whispering gallery mode (WGM) based filter, reduce the BR noise source solely to what is reflected from the beam splitter face. A net reflection of 0.05% can yield an OOB rejection in excess of 35 dB. Rotating the beam splitting cube by ½° about its axis will further reduce the effects of the surface reflection.

Figure 12:
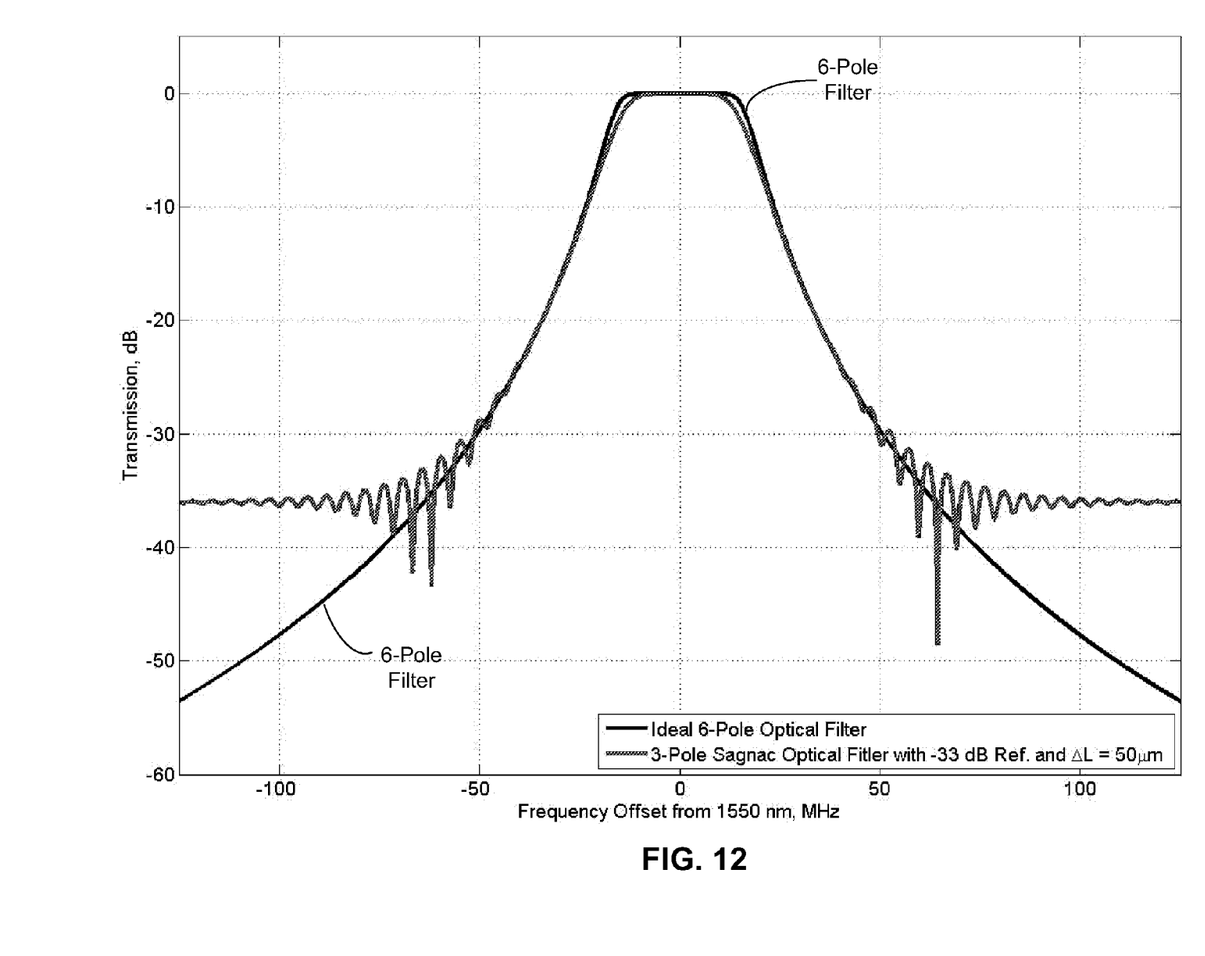
FIG. 12 shows a comparison of filter transfer functions of a 3-pole filter in an optical Sagnac configuration based on FIG. 11 and a 6-pole optical filter based on FIG. 1.

Unlike the RF/microwave regime, in the optical regime the path length mismatch is more difficult to minimize. An adjustable optical delay device or an optical phase shifter, such as a Pockells cell, a heated window, or piezo stretched optic, can be used to equalize the paths in FIG. 11. In some implementations, a total path length difference of 50 microns is not unreasonable to achieve. Based on this figure and the availability of AR.18 coated optics, the simulated result of an optical 3-pole sagnac filter is plotted next to an ideal 6-pole optical filter in FIG. 12 where an ideal 6-pole optical filter (black) and Sagnac configuration 3-pole optical filter with 0.05% reflection coefficient from BSC face, and 50 micron difference in paths are shown. Increasing the path difference increases the amount of out-of-band ripple, while decreasing it decreases the ripple. Increasing the face reflection brings the mean OOB rejection closer to 0 dB, while decreasing the face rejection pushes OOB rejection closer to 0 (linear.)

In FIG. 11, the N-pole optical filter 110 can be achieved by optically coupling multiple optical resonators or filters to one another. U.S. Pat. No. 6,987,914 entitled "Optical filter having coupled whispering-gallery-mode resonators" and issued on Jan. 17, 2006 provides some examples of high order optical filters having at least two coupled whispering-gallery-mode (WGM) optical resonators to produce a second order or higher order filter function with a desired spectral profile. At least one of the coupled WGM optical resonators may be tunable by a control signal to adjust the filtering function. U.S. Pat. No. 7,587,144 entitled "Tunable Radio frequency and microwave photonic filters" provides additional examples of multi-pole optical filters based on two or more filters that are cascaded or coupled to one another. The entire disclosures of U.S. Pat. No. 6,987,914 and U.S. Pat. No. 7,587,144 are incorporated by reference as part of the disclosure of this patent document.

Given the practical difficulty in extending optical filters beyond a small number of poles, the Sagnac filter configuration can be applied to replicate many of the advantages of higher-pole filters. The relative trade-offs of a Sagnac configured N-pole filter and a traditional 2N pole filter are summarized in Table 1.

TABLE 1

Performance Comparison

| Quantity/Parameter | Ideal 2N-Pole Filter | N-Pole Dual Pass Filter | N-Pole Sagnac Filter |
|---|---|---|---|
| Center Frequency | 0 | 0 | 0 |
| Insertion Loss | 0 | +6 dB | 0 |
| Pass Bandwidth | X | X | X |
| Phase Near CF | 2N-like | 2N-like | 2N-like |
| Phase Away from CF | 2N-like | N-like | 2N-like |
| Out of Band Rejection | 2N-like | 10 dB worse than Sagnac | Limit by coupler BR |
| OOB Intensity Ripple | None | Limit by path lengths | Limit by path lengths |

In implementations in FIGS. 3 and 6 where the filter 110 is an RF filter, this RF filter can be in various configurations, including RF filters formed of electronic circuit components and photonic RF filters formed of both electronic circuit components and optical components such as high-Q optical resonators. A photonic RF filer has RF input and output ports or terminals just like an RF filter entirely formed of electronic circuit components and thus is not different from a non-photonic RF filter in its operation and connection with other devices.

The internal structure and operation of a photonic RF filter are very different from a non-photonic RF filter. In some implementations of photonic RF filters, a part of the processing is performed in the RF and microwave domain such as applying a microwave or RF input signal to an optical modulator to control optical modulation of light, and another part of the processing is performed in the optical domain such as optical filtering of the modulated light to select one or more desired microwave or RF spectral components as the filtered output. The frequency of a selected spectral component can be tuned by either tuning the frequency of the light that is modulated by the optical modulator or an optical filter that is used to optically filter modulated optical beam. Photonic RF filters use an input port to receive a microwave or RF signal, and an output port to export a filtered microwave or RF signal. The input signal is converted into optical domain via optical modulation of a continuous-wave optical beam and the modulated optical beam is then optically filtered to select desired microwave or RF spectral components. An optical filter with a high quality factor can produce ultra narrow linewidth to optically select one or more desired microwave or RF spectral components carried in the modulated optical beam. Such optical filtering of microwave or RF spectral components avoids use of microwave or RF filters that tend to suffer a number of limitations imposed by the electronic microwave or RF circuit elements. The filtered optical signal and a portion of the same continuous-wave optical beam are combined and sent into an optical detector. The output of the optical detector is used as the filtered or processed non-optical signal. Like signal filtering, the frequency tuning of the filtering in these implementations can also be achieved optically in some implementations, e.g., by either tuning the frequency of the optical beam that is modulated by the optical modulator or an optical filter that is used to filter modulated optical beam. Examples of photonic RF filters can be found in U.S. Pat. No. 7,587,144 for Tunable radio frequency and microwave photonic filters, U.S. Pat. No. 7,634,201 for Wideband receiver based on photonics technology, U.S. Pat. No. 7,389,053 for Tunable filtering of RF or microwave signals based on optical filtering in Mach-Zehnder configuration, which are incorporated by reference as part of the disclosure of this patent document.

In addition, the device examples in FIGS. 3, 6 and 11 may incorporate various levels of integration over a substrate. For example, the illustrated device examples can be implemented in planar architectures on semiconductor substrates such as silicon wafers. In some implementations, optical WGM resonators can be monolithically integrated on a substrate in various configurations, e.g., an optical WGM resonator may be integrated on a planar semiconductor structure. The optical WGM resonator may be optical disk or ring resonators integrated on a substrate on which other components of the device are also integrated, including the electronic circuit elements of the devices.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations, enhancements and other implementations can be made based on what is described and illustrated in this document.

What is claimed is:

1. A device for filtering a signal at a radio frequency (RF) or optical frequency, comprising:
   a signal coupler that has a first coupler port for receiving an input signal to be filtered and splits the received input signal into a first input signal and a second input signal, the signal coupler further including a second coupler port that outputs the first input signal, a third coupler port that outputs the second input signal, and a fourth coupler port; and
   a filter including a filter input port coupled to the second coupler port to receive the first input signal and a filter output port for outputting a first filtered signal by filtering the first input signal, wherein the filter is configured to have a spectral transmission band that transmits spectral signal components of a signal that passes through and is filtered by the filter as a filtered output signal while blocking other spectral components,
   wherein the filter output port is coupled to the third coupler port for receiving the second input signal to produce a second filtered signal at the filter input port by filtering the second input signal and for directing the first filtered signal to the third coupler port, and
   wherein the first filtered signal received at the third coupler port of the signal coupler and the second filtered signal received at the second coupler port are mixed to interfere with each other in the signal coupler to produce a final signal a part of which is output at the fourth coupler port as a filtered output signal of the device.

2. The device as in claim 1, wherein:
   the filter is an N-pole filter where N is an integer and the filtered output signal at the fourth coupler port exhibits characteristics of a filtered signal of a 2N-pole filter without having a 2N-pole filter in the device.

3. The device as in claim 1, wherein:
   the filter is an N-pole Butterworth filter where N is an integer.

4. The device as in claim 1, wherein:
   the signal coupler is a 3 dB directional coupler that splits the input signal received at the first coupler port into two equal parts as the first and second input signals at the second and third coupler ports, respectively.

5. The device as in claim 1, wherein:
   the signal coupler has an interaction length (L) for performing signal coupling that is greater than a wavelength of the input signal.

6. The device as in claim 1, wherein:
   the input signal is an optical input signal;
   the signal coupler includes a directional optical coupler;
   the filter includes an optical bandpass filter; and
   the directional optical coupler and the optical bandpass filter are coupled to each other to effectuate a Sagnac optical interferometer.

7. The device as in claim 6, wherein:
   the optical bandpass coupler includes an optical whispering gallery mode (WGM) resonator.

8. The device as in claim 6, wherein:
   the signal coupler includes optical waveguides.

9. The device as in claim 1, wherein:
   the input signal is an optical input signal, and
   the signal coupler includes an optical beam splitter that splits the optical input signal received at the first coupler port into the first and second input signals.

10. The device as in claim 1, wherein:
    the input signal is an RF input signal;
    the signal coupler is a directional RF coupler;
    the filter is an RF bandpass filter; and
    the directional RF signal coupler and the RF bandpass filter are coupled to each other to effectuate a Sagnac RF interferometer.

11. The device as in claim 10, wherein:
    the RF bandpass filter is a photonic RF filter that includes (1) electronic circuit elements that perform part of filter processing in the RF domain and (2) optical elements that perform part of the filter processing in the optical domain.

12. A method for filtering a signal at a radio frequency (RF) or optical frequency, comprising:
    splitting an input signal to be filtered into a first input signal and a second input signal;
    operating a spectral bandpass filter, which is configured to have a spectral transmission band that transmits spectral signal components of a signal that passes through the filter as a filtered output signal while blocking other spectral components, to filter the first input signal as a first filtered signal;
    operating the same spectral bandpass filter to filter the second input signal as a second filtered signal; and
    bringing the first and second filtered signals to together to cause an interference between the first and second filtered signals to produce an interference signal as a filtered output signal to effectuate a higher order filter operation than what the filter is designed for.

13. The method as in claim 12, wherein:
    the filter is a photonic RF filter that performs one or more operations for signal filtering in the optical domain and one or more operations of signal filtering in the RF domain.

14. The method as in claim 12, wherein the input signal is an optical signal and the filter is an optical filter.

15. The method as in claim 12, wherein the input signal is an RF signal and the filter is an RF filter.

16. The method as in claim 12, comprising:
    operating a Sagnac interferometer that includes the filter in providing the interference between the first and second filtered signals to produce the interference signal while automatically canceling out an effect of a path difference between signal paths associated with the first and second filtered signals on the interference signal.

17. A device for filtering a signal at a radio frequency (RF) or optical frequency, comprising:
    a signal coupler that receives an input signal to be filtered and outputs at least a portion of the received input signal as a coupler output signal and a second input signal, the signal coupler further receives a feedback signal that is generated based on the coupler output signal and mixes the feedback signal and the received input signal to produce the coupler output signal;
    a filter exhibiting N poles and including a filter input port in communication with the signal coupler for receiving the coupler output signal and a filter output port for outputting a filtered signal by filtering the coupler output signal, wherein the filter is configured to have a spectral transmission band that transmits spectral signal components of a signal that passes through the filter as a filtered output signal while blocking other spectral components; and
    a signal power divider in communication with the filter output port to receive the filtered signal and to split the received filtered signal into a first signal as the filtered output signal of the device and a second signal as the feedback signal to the signal coupler; and a feedback path coupled between the signal coupler and the signal power divider to carry the feedback signal, wherein the second signal is a filtered version of the input signal and thus feeding back of the second signal to the signal coupler enables a double pass configuration for the filter to render the filtered output signal to exhibit characteristics of a filtered signal of a 2N-pole filter.

18. The device as in claim 17, comprising:

a phase shifter coupled between the signal coupler and the filter output port of the filter in a signal path of the feedback signal, the phase shifter operable to control a phase of the feedback signal at the signal coupler.

19. The device as in claim 17, wherein:

the input signal is an optical input signal;

the signal coupler includes an optical coupler; and the filter includes an optical bandpass filter.

20. The device as in claim 17, wherein:

the input signal is an RF input signal;

the signal coupler includes an RF coupler; and the filter includes an RF bandpass filter.

21. The device as in claim 20, wherein:

the RF bandpass filter is a photonic RF filter that includes (1) electronic circuit elements that perform part of filter processing in the RF domain and (2) optical elements that perform part of the filter processing in the optical domain.

* * * * *